(12) United States Patent
Sutardja

(10) Patent No.: US 8,970,002 B2
(45) Date of Patent: Mar. 3, 2015

(54) METAL OXIDE METAL CAPACITOR STRUCTURES

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/465,621

(22) Filed: May 7, 2012

(65) Prior Publication Data

US 2012/0286394 A1 Nov. 15, 2012

Related U.S. Application Data

(60) Provisional application No. 61/484,102, filed on May 9, 2011.

(51) Int. Cl.
| | | |
|---|---|---|
| H01L 21/02 | (2006.01) | |
| H01G 4/10 | (2006.01) | |
| H01G 4/005 | (2006.01) | |
| H01G 4/228 | (2006.01) | |
| H01L 49/02 | (2006.01) | |
| H01L 23/522 | (2006.01) | |

(52) U.S. Cl.
CPC ............... *H01G 4/10* (2013.01); *H01G 4/005* (2013.01); *H01G 4/228* (2013.01); *H01L 28/60* (2013.01); *H01L 28/86* (2013.01); *H01L 28/90* (2013.01); *H01L 23/5223* (2013.01)
USPC ........................................................ 257/532

(58) Field of Classification Search
CPC ..................... H01L 27/0805; H01L 27/0733
USPC ........... 257/532, E29.343, 303; 438/171, 239
See application file for complete search history.

(56) References Cited

U.S. PATENT DOCUMENTS

| | | | |
|---|---|---|---|
| 6,373,087 B1 | 4/2002 | Harris et al. | |
| 7,446,390 B2 * | 11/2008 | Okuda et al. | 257/532 |
| 7,724,174 B2 * | 5/2010 | Chang et al. | 341/163 |
| 8,207,567 B2 * | 6/2012 | Chin et al. | 257/303 |
| 2008/0001255 A1 | 1/2008 | Okuda et al. | |
| 2010/0038752 A1 * | 2/2010 | Ng et al. | 257/532 |
| 2010/0085225 A1 | 4/2010 | Chang et al. | |
| 2010/0271753 A1 | 10/2010 | Wang et al. | |
| 2010/0309605 A1 | 12/2010 | Lin | |

OTHER PUBLICATIONS

Notification of Transmittal of The International Search Report and The Written Opinion of The International Searching Authority, or The Declaration dated Mar. 7, 2013 in reference to PCT/US2012/036897 (10 pgs).

* cited by examiner

*Primary Examiner* — Jarrett Stark
*Assistant Examiner* — Shahed Ahmed

(57) ABSTRACT

A metal oxide metal (MOM) capacitor includes an outer conducting structure defined in a plurality of metal layers and a plurality of via layers of an integrated circuit including first opposing side walls, second opposing side walls, a cavity with first and second openings, and openings in the first opposing side walls. An inner conducting structure is defined in the plurality of metal layers and the plurality of via layers of the integrated circuit. The inner conducting structure is arranged in the cavity of the outer conducting structure and includes a body, and conducting extensions that extend from the body through the openings in the first opposing side walls. Oxide is arranged between the outer conducting structure and the inner conducting structure.

15 Claims, 11 Drawing Sheets

METAL OXIDE METAL CAPACITOR STRUCTURES

CROSS-REFERENCE TO RELATED APPLICATIONS

This application claims the benefit of U.S. Provisional Application No. 61/484,102, filed on May 9, 2011. The disclosure of the above application is incorporated herein by reference in its entirety.

FIELD

The present disclosure relates to capacitors, and more particularly to metal oxide metal (MOM) capacitors.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Circuits such as successive approximation (SAR) analog to digital converters (ADCs) and/or other circuits may include a capacitor array with multiple capacitors. The capacitors in the capacitor array usually have large geometries in order to keep parasitic capacitance below design specifications (usually well below inherent capacitance values). To build the capacitor array with many capacitors, large capacitance values and array area is required, which increases cost.

SUMMARY

A metal oxide metal (MOM) capacitor includes an outer conducting structure defined in a plurality of metal layers and a plurality of via layers of an integrated circuit including first opposing side walls, second opposing side walls, a cavity with first and second openings, and openings in the first opposing side walls. An inner conducting structure is defined in the plurality of metal layers and the plurality of via layers of the integrated circuit. The inner conducting structure is arranged in the cavity of the outer conducting structure and includes a body, and conducting extensions that extend from the body through the openings in the first opposing side walls. Oxide is arranged between the outer conducting structure and the inner conducting structure.

In other features, the outer conducting structure has a rectangular cross section in each of the plurality of metal layers. First trench vias in the plurality of via layers are used to connect conducting sections in adjacent ones of the metal layers of the outer conducting structure. The inner conducting structure has a rectangular cross section in each of the plurality of metal layers. Second trench vias connect conducting sections in adjacent ones of the metal layers of the inner conducting structure.

In other features, the outer conducting structure has a rectangular cross section in each of the plurality of metal layers. First hole vias in the plurality of via layers are arranged in a plurality of columns and connect conducting sections in adjacent ones of the metal layers of the outer conducting structure. The inner conducting structure has a rectangular cross section in each of the plurality of metal layers. Second hole vias in the plurality of via layers are arranged in a plurality of columns and connect conducting sections in adjacent ones of the metal layers of the inner conducting structure.

In other features, the inner conducting structure has a rectangular cross section in each of the plurality of metal layers. Second hole vias in the plurality of via layers are arranged in a single column and connect conducting sections in adjacent ones of the metal layers of the inner conducting structure. Each of the plurality of columns is arranged in corners of the outer conducting structure.

A capacitor array comprises a plurality of the MOM capacitors. The plurality of MOM capacitors are arranged in N rows and M columns. Each of the plurality of MOM capacitors shares at least two of the first opposing walls and the second opposing walls with adjacent ones of the plurality of MOM capacitors. The conducting extensions of first selected ones of the plurality of MOM capacitors are connected together and to a first capacitor input. The outer conducting structures of the plurality of MOM capacitors are connected to a second capacitor input.

In other features, the conducting extensions of second selected ones of the plurality of MOM capacitors are connected together and to a reference impedance. The inner conducting structures of second selected ones of the plurality of MOM capacitors are not connected to others of the plurality of MOM capacitors. Internal connections are used when connecting MOM capacitors in the same column, External connections are used when connecting MOM capacitors in adjacent columns.

In other features, a first conducting wall including a first plurality of openings. The openings in one of the first opposing side walls of a first row of the plurality of MOM capacitors in the capacitor array align with the plurality of openings in the first conducting wall. The first conducting wall is connected to a reference impedance.

In other features, a second conducting wall includes a second plurality of openings. The openings in the other of the first opposing side walls of a last row of the plurality of MOM capacitors of the capacitor array align with the second plurality of openings in the second conducting wall. The second conducting wall is connected to the reference impedance.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

The present disclosure describes various metal oxide metal (MOM) capacitors that are fabricated in integrated circuits. In some examples of the MOM capacitor according to the present disclosure, an outer conducting structure of the MOM capacitor surrounds an inner conducting structure. Connection is made to the inner conducting structure by one or more conducting extensions that extend through openings in the outer conducting structure. Arrays including two or more MOM capacitors may also be formed. In some examples of the present disclosure, a Faraday wall is arranged adjacent to an outer boundary of the capacitor array to allow connection to the array without increasing parasitic capacitance to surrounding conducting walls of an adjacent array or MOM capacitor.

Figure 1:
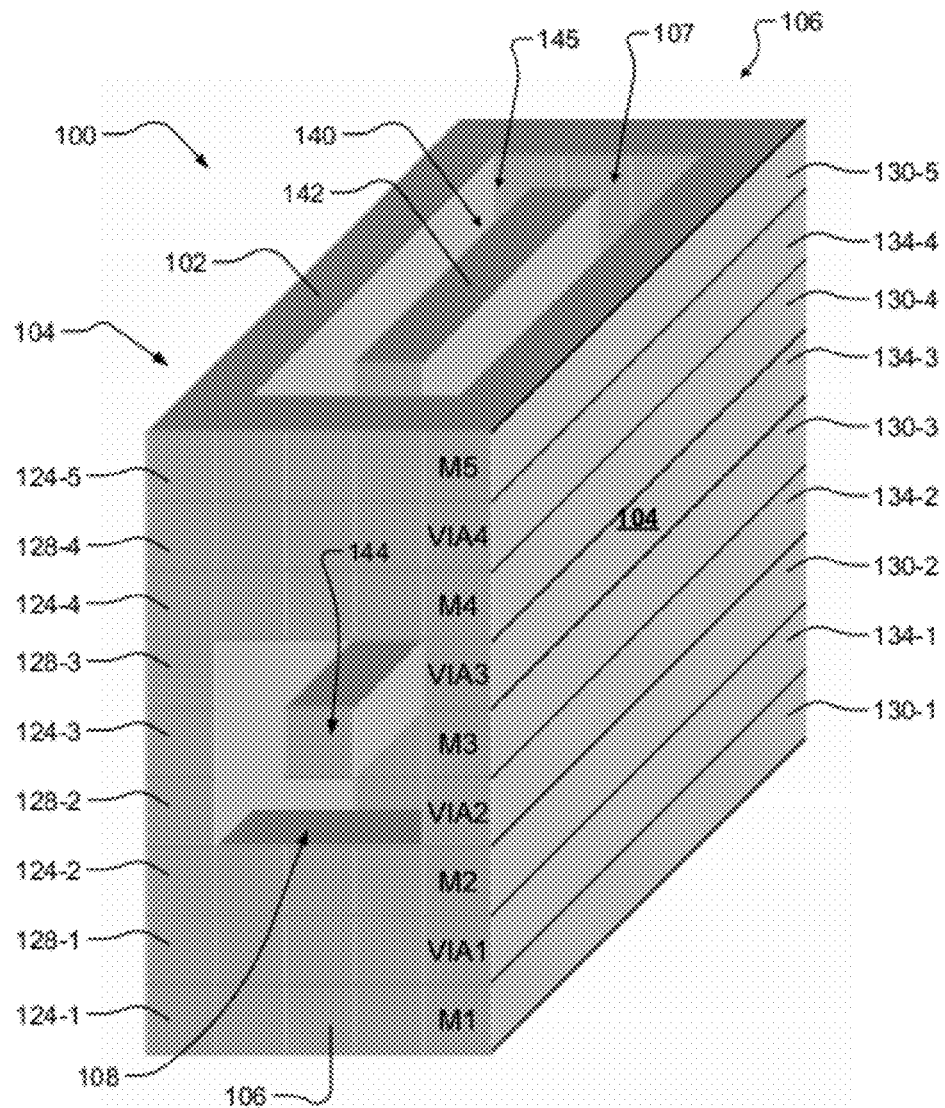
FIG. 1 is a perspective view illustrating a metal oxide metal (MOM) capacitor according to the present disclosure.

Referring now to FIG. 1, a MOM capacitor 100 according to the present disclosure is shown. The MOM capacitor 100 may be fabricated in a multi-layer integrated circuit. The MOM capacitor 100 includes an outer conducting structure 102 with opposing walls 104 and opposing walls 106. The outer conducting structure 102 defines a cavity with top and bottom openings 107. The opposing walls 106 also define openings 108. In the example shown in FIG. 1, the outer conducting structure 102 defines a rectangular box section.

The MOM capacitor 100 is defined in alternating metal layers and via layers of an integrated circuit. More particularly, the MOM capacitor 100 is defined in metal layers 124-1 (or metal 1 (M1)), 124-2 (or M2), 124-3 (or M3), 124-4 (or M4), and 124-5 (or M5) (collectively metal layers 124) and intervening via layers 128-1 (or VIA1), 128-2 (or VIA2), 128-3 (or VIA3), and 128-4 (or VIA4) (collectively via layers 128). While five metal layers are shown, additional or fewer metal layers and intervening via layers may be used to create the MOM capacitor 100.

As used herein, the term "hole via" refers to a conventional via that normally has a generally square shape. The term "trench via" refers to a conventional via that has been oversized in one or more directions.

Each of the opposing walls 104 and 106 of the outer conducting structure 102 includes conducting sections 130-1, 130-2, 130-3, 130-4, and 130-5 (collectively conducting sections 130) defined in metal layers 124-1, 124-2, 124-3, 124-4, and 124-5, respectively. Each of the opposing walls 106 and 108 of the outer conducting structure 102 includes trench vias 134-1, 134-2, 134-3, and 134-4 (collectively trench vias 134) defined in via layers 128-1, 128-2, 128-3, and 128-4, respectively.

The MOM capacitor 100 further includes an inner conducting structure 140 that is arranged inside of the outer conducting structure 102. The inner conducting structure 140 includes a center section 142 and conducting extensions 144 that extend from the center section 142 through the openings 108 in the outer conducting structure 102. In some examples, the center section 142 has a rectangular shape. While one conducting extension is shown at each side, additional conducting extensions can be used. Likewise, while the location of the conducting extensions 144 is shown centered along sides of the inner conducting structure 140, the location of the conducting extensions 144 can be in any of the metal layers. Because the conducting extensions 144 extend through the walls 106, the conducting extensions 144 act as built-in connections and consequently the inherent capacitance of the connections to the inner conducting structure is minimized or eliminated as compared to conventional connections which tend to have higher parasitic capacitance. This higher parasitic capacitance of conventional designs is further increased when scaled into capacitance arrays.

Oxide-based material 145 is located in areas other than the outer conducting structure 102 and the inner conducting structure 140 and connections thereto.

Figure 2:
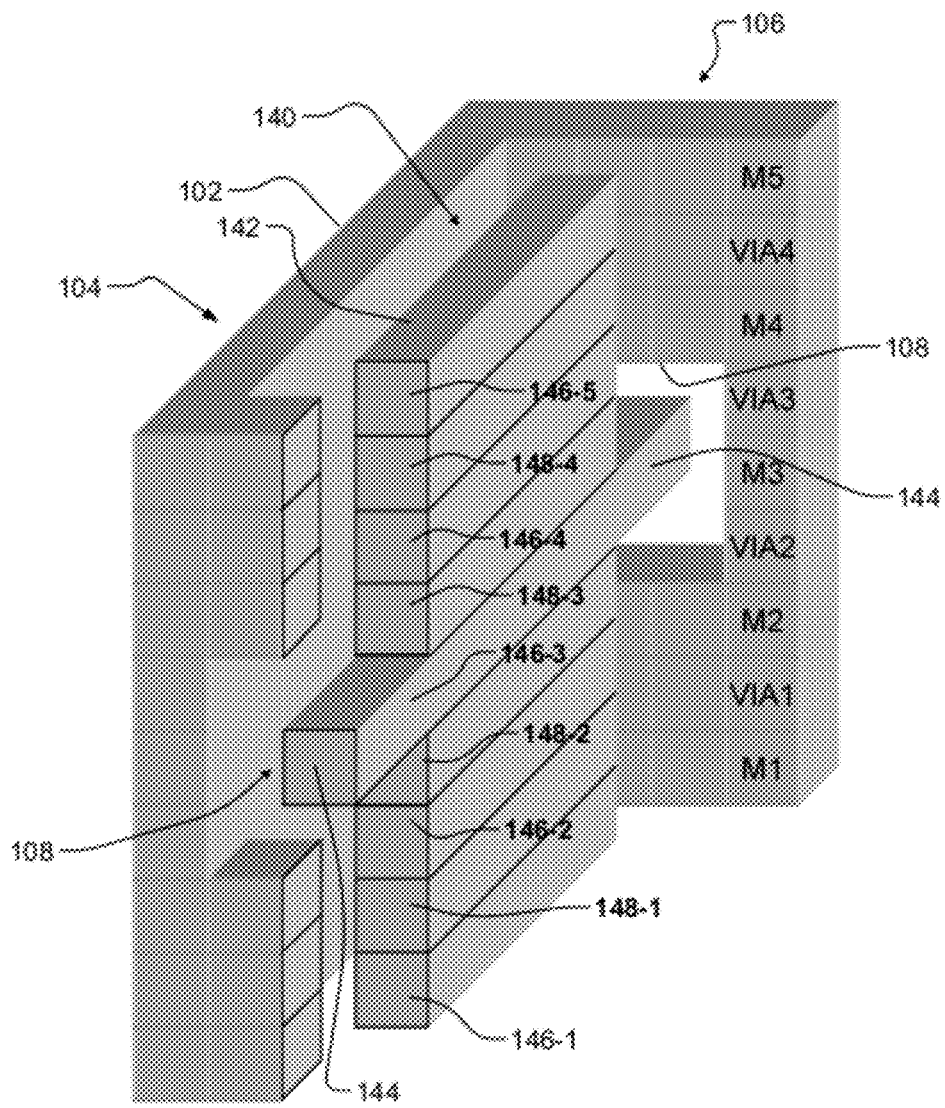
FIG. 2 is a partial perspective view illustrating the MOM capacitor of FIG. 1.

Referring now to FIG. 2, the inner conducting structure 140 can be seen in more detail. As can be seen, the conducting extensions 144 extend through the openings 108. The center section 142 includes aligned, rectangular conducting sections 146-1, 146-2, 146-3, 146-4, and 146-5 (collectively conducting extensions 146) (in metal layers 124-1, 124-2, 124-3, 124-4, and 124-5, respectively). The center section 142 includes aligned, rectangular trench vias 148-1, 148-2, 148-3, and 148-4 (collectively trench vias 148) (in via layers 128-1, 128-2, 128-3, and 128-4, respectively).

Figure 3:
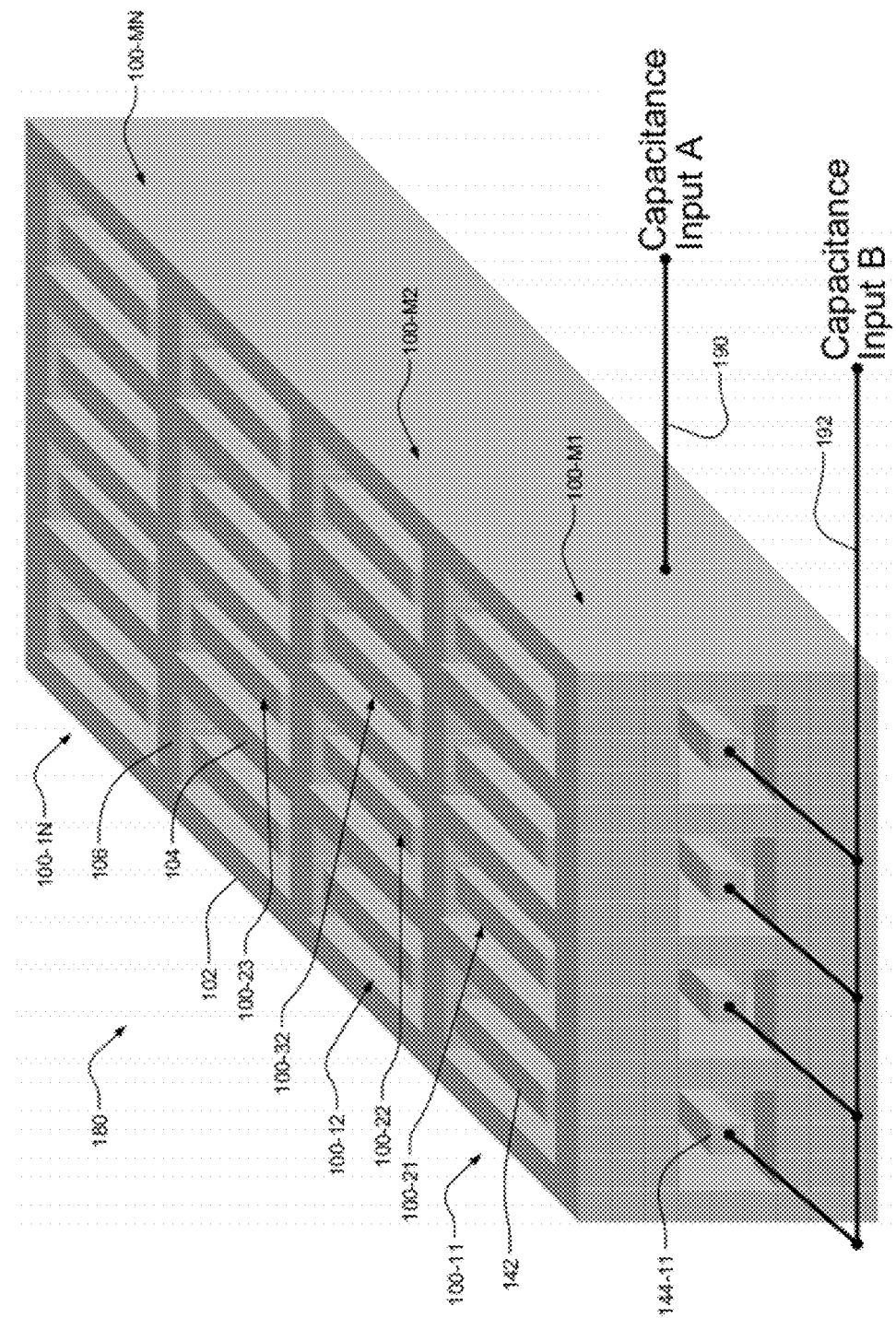
FIG. 3 is a perspective view illustrating an array of the MOM capacitors of FIG. 1.
Figure 4:
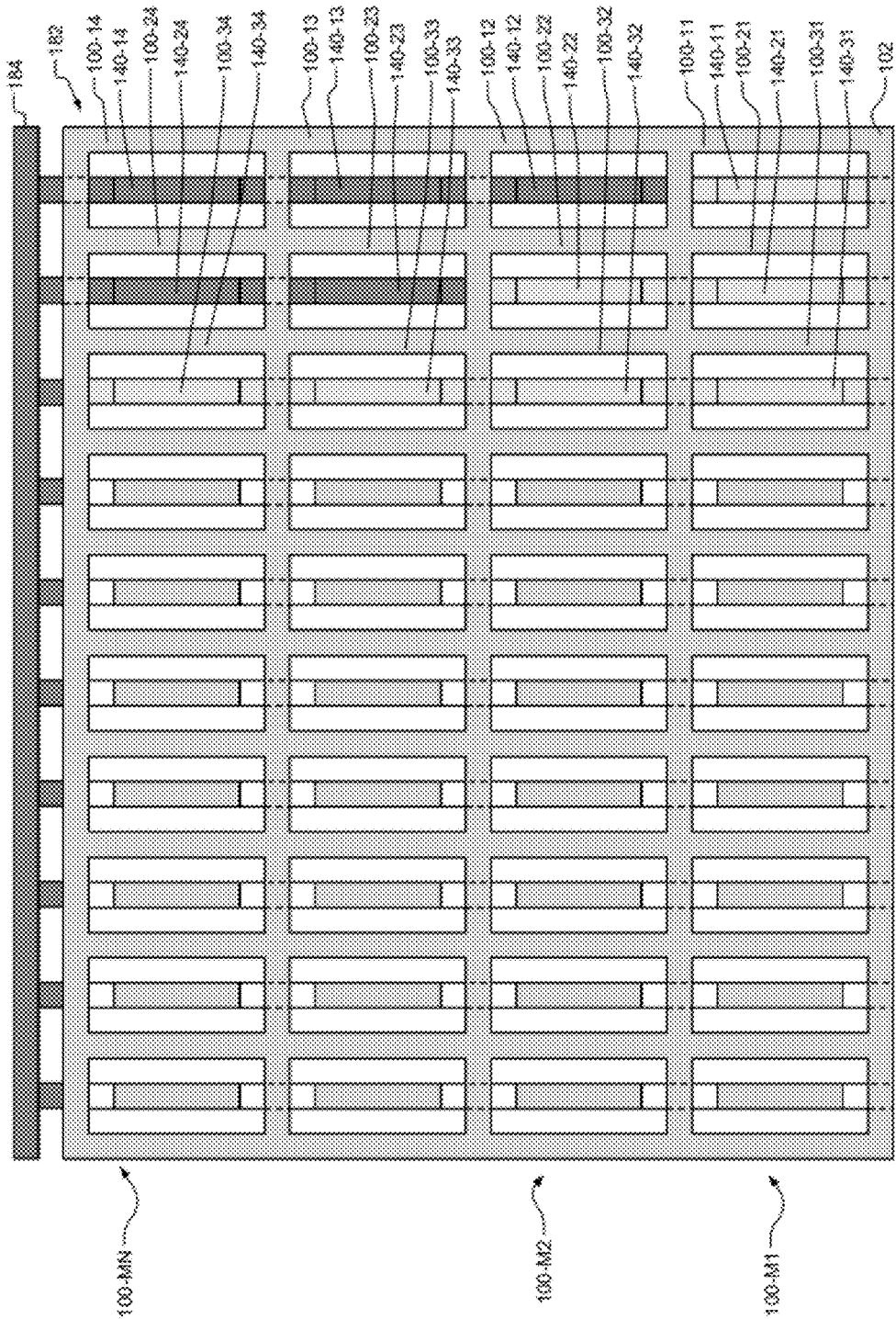
FIG. 4 is a plan view illustrating the array of FIG. 3.

Referring now to FIGS. 3-4, the MOM capacitor 100 of FIG. 1 can be implemented in an array 180. The array 180 includes a plurality of MOM capacitors 100-11, 100-12, . . . and 100-MN (collectively MOM capacitors 100). Each of the MOM capacitors 100 shares at least two of opposing walls 104 and 106 with adjacent ones of the MOM capacitors 100. For example only, the MOM capacitor 100-22 shares walls with the MOM capacitor 100-21, the MOM capacitor 100-12, the MOM capacitor 100-23 and the MOM capacitor 100-32.

Zero or more of the MOM capacitors 100 in a column (such as MOM capacitors 100-11 to 100-1N) may be connected by the conducting extensions 144 through corresponding ones of the openings 108. Since the conducting extensions 144 act as built-in connections, capacitance associated with the built-in connections is taken into consideration when calculating the overall capacitance of each MOM capacitor 100. Consequently, errors in capacitance value normally introduced by conventional connections may be eliminated or minimized. Connections between columns may be made by a connection that is external to the array 180. For example in FIG. 3, external connections 190 and 192 may be used to connect signals to selected capacitors in the capacitor array 180.

As can be seen in FIG. 4, the connections between the MOM capacitors 100 in a column may be varied to adjust the capacitance of the column. Likewise, the connections between capacitors in adjacent columns may be varied to adjust the overall capacitance of an array 182. In the example in FIG. 4, the inner conducting structures 140-12, 140-13, 140-14, 140-23 and 140-24 associated with MOM capacitors 100-12, 100-13, 100-14, 100-23 and 100-24, respectively, are connected to a low impedance reference 184 (at a top of the array 182). The inner conducting structures 140-34, 140-33, 140-32, 140-31, 140-22, 140-21 and 140-11 associated with MOM capacitors 100-34, 100-33, 100-32, 100-31, 100-22, 100-21 and 100-11, respectively, are connected to one input of the capacitor array 1820 (connection not shown). The outer conducting structures 102 for all of the MOM capacitors 100 are connected together and to another input of the capacitor array 182 (connection not shown).

Figure 5:
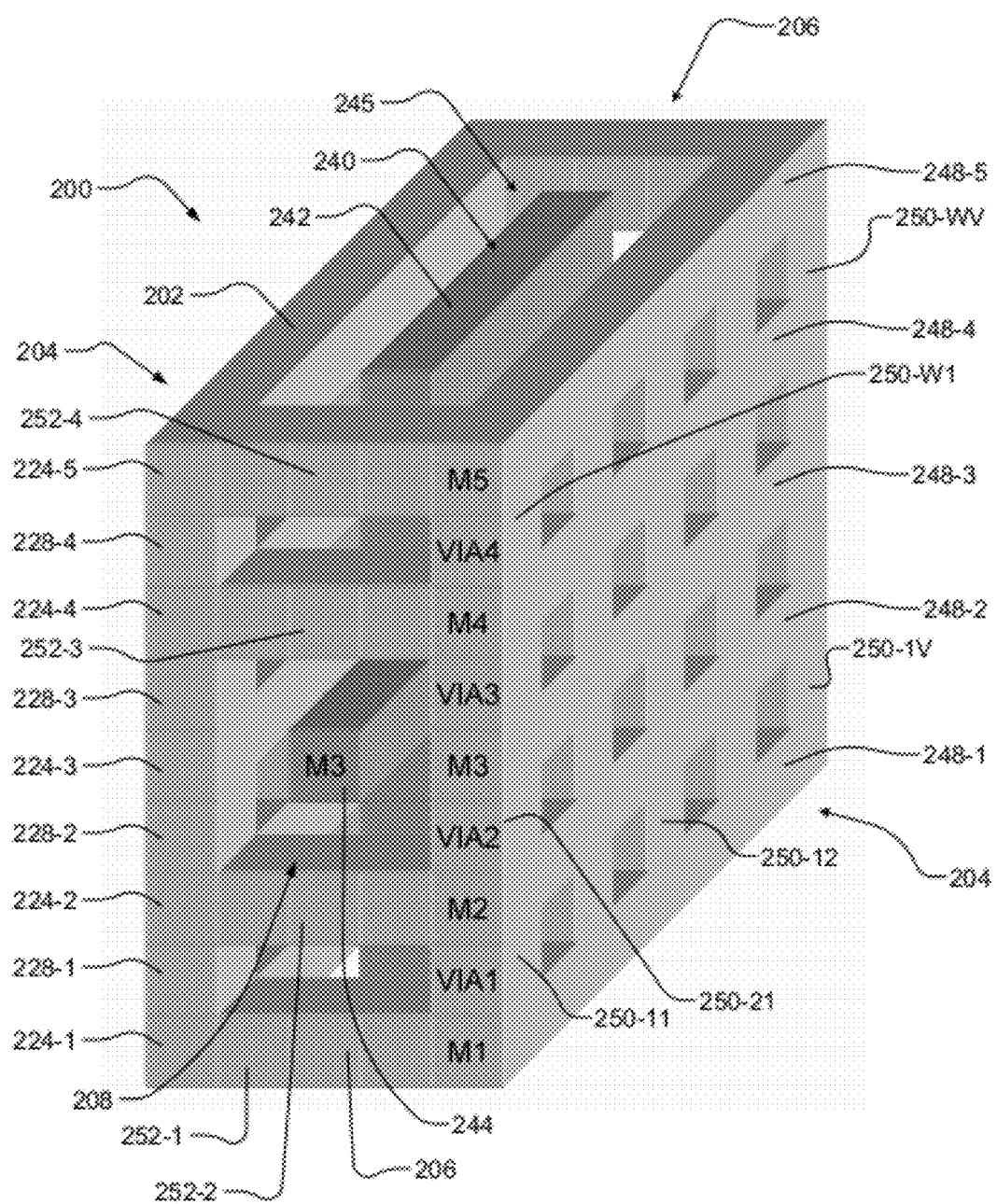
FIG. 5 is a perspective view illustrating another MOM capacitor according to the present disclosure.
Figure 6:
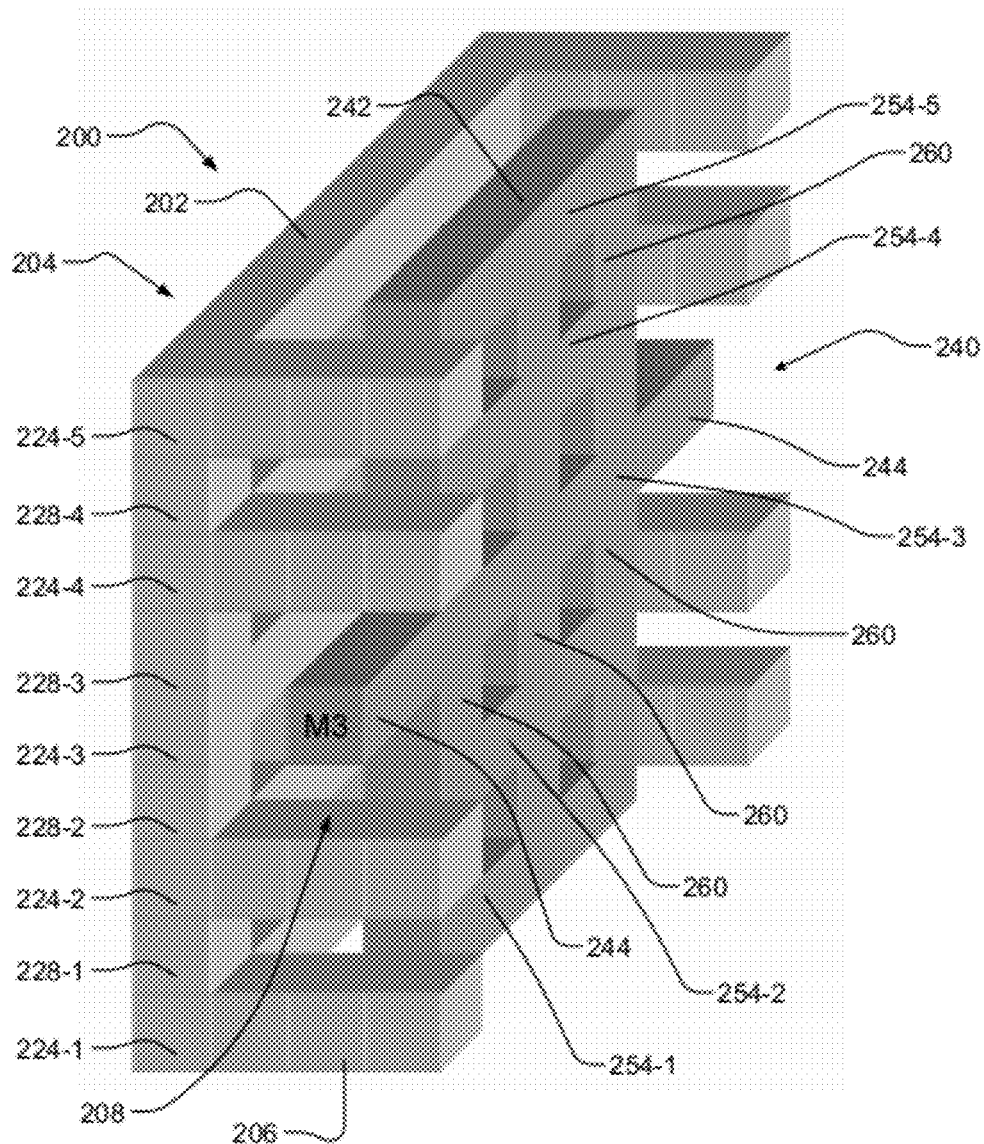
FIG. 6 is a partial perspective view illustrating the MOM capacitor of FIG. 5.

Referring now to FIGS. 5-6, a MOM capacitor 200 that is similar to the MOM capacitor 100 in FIG. 1 is shown. The MOM capacitor 200 employs hole vias rather than trench vias to increase spacing between vias. Increasing spacing between vias tends to reduce the chance of a short due to misalignment during fabrication. The MOM capacitor 200 may be fabricated in a multi-layer integrated circuit. In FIG. 5, the MOM capacitor 200 includes an outer conducting structure 202. The outer conducting structure 202 includes opposing walls 204 and opposing walls 206.

The MOM capacitor 200 includes metal layers 224-1 (or M1)), 224-2 (or M2), 124-3 (or M3), 224-4 (or M4), and 224-5 (or M5) (collectively metal layers 224) with intervening via layers 228-1 (or VIA1), 228-2 (or VIA2), 228-3 (or VIA3), and 228-4 (or VIA4) (collectively via layers 228). While five metal layers are shown, additional or fewer metal layers and intervening via layers may be used.

The sidewalls 204 define a lattice-like structure including conducting sections 248-1, 248-2, 248-3, 248-4 and 248-5 (collectively referred to as conducting sections 248) in the metal layers 224-1, 224-2, 224-3, 224-4 and 224-5, respectively, and spaced hole vias 250-11, 250-12, . . . , and 250-WV (collectively referred to as hole vias 250) in the via layers 228-1, 228-2, 228-3, 228-4, and 228-5, respectively.

The opposing walls 206 are defined by conducting sections 252-1, 252-2, 252-3, and 252-4 in the metal layers 224-1, 224-2, 224-4 and 224-5, respectively. The spaced hole vias 250-11, 250-21, . . . and 250-W1 and 250-1V, 250-2V, . . . and 250WV may be arranged in corners of the outer conducting structure 202. An elongate conducting section is omitted in the metal layer 224-3 to allow conducting extensions 244 to pass through an opening 208 in the opposing walls 206. Oxide 245 is located between the inner and outer conducting structures 240 and 202.

In FIG. 6, an inner conducting structure 240 is arranged inside of the outer conducting structure 202 and includes a center section 242 and the conducting extensions 244. As can be seen, the conducting extensions 244 extend through opposing walls 206. The center section 242 defines a lattice structure including elongate conducting sections 254-1, 254-2, 254-3, 254-4 and 254-5 (collectively conducting extensions 254) in the metal layers 224 and spaced hole vias 260 in the via layers 228. In the example in FIGS. 5-6, while three hole vias are used in each of the via layers of the inner conducting structure, additional or fewer hole vias can be used. Alternately, combinations of hole vias and trench vias may be used in any of the via layers in the inner and outer conducting structures described herein.

The oxide-based material 245 is located in areas other than the outer conducting structure 202 and the inner conducting structure 240 and connections thereto. The number of column vias and the spacing between the columns can be adjusted to be greater than or less than the number and spacing depicted in FIGS. 5-6.

Figure 7:
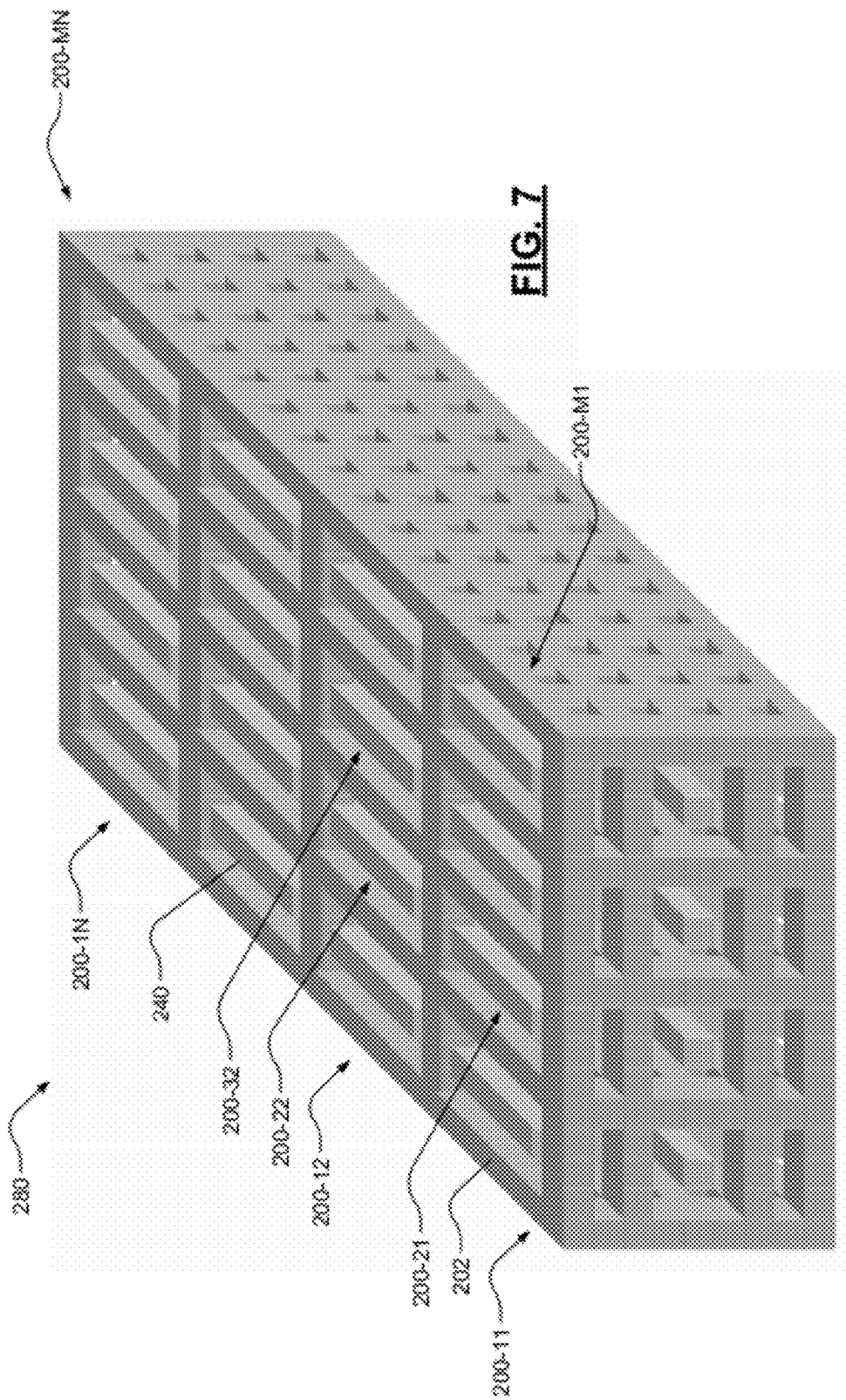
FIG. 7 is a perspective view illustrating an array of the MOM capacitors of FIG. 5.

Referring now to FIG. 7, the MOM capacitor 200 of FIG. 5 can be implemented in a MOM capacitor array 280. The MOM capacitor array 280 includes a plurality of MOM capacitors 200-11, 200-12, . . . and 200-MN. Each of the MOM capacitors 200 shares at least two of opposing walls 204 and opposing walls 206 with adjacent ones of the MOM capacitors 200. For example only, the MOM capacitor 200-22 shares walls with the MOM capacitor 200-21, the MOM capacitor 200-12, the MOM capacitor 200-23 and the MOM capacitor 200-32. The MOM capacitors 200 in a column (such as MOM capacitors 200-11 to 200-1N) may be selectively connected by the conducting extensions 244.

Connections between columns are made by a connection (not shown) external to the array 280. The connections between the MOM capacitors in a column may be varied to adjust the capacitance of the column. Likewise, the connections between capacitors in adjacent columns may be varied to adjust the overall capacitance of the array 280. Connections to the MOM capacitor array 280 may be made in a manner similar to that shown in FIGS. 3-4.

Figure 8:
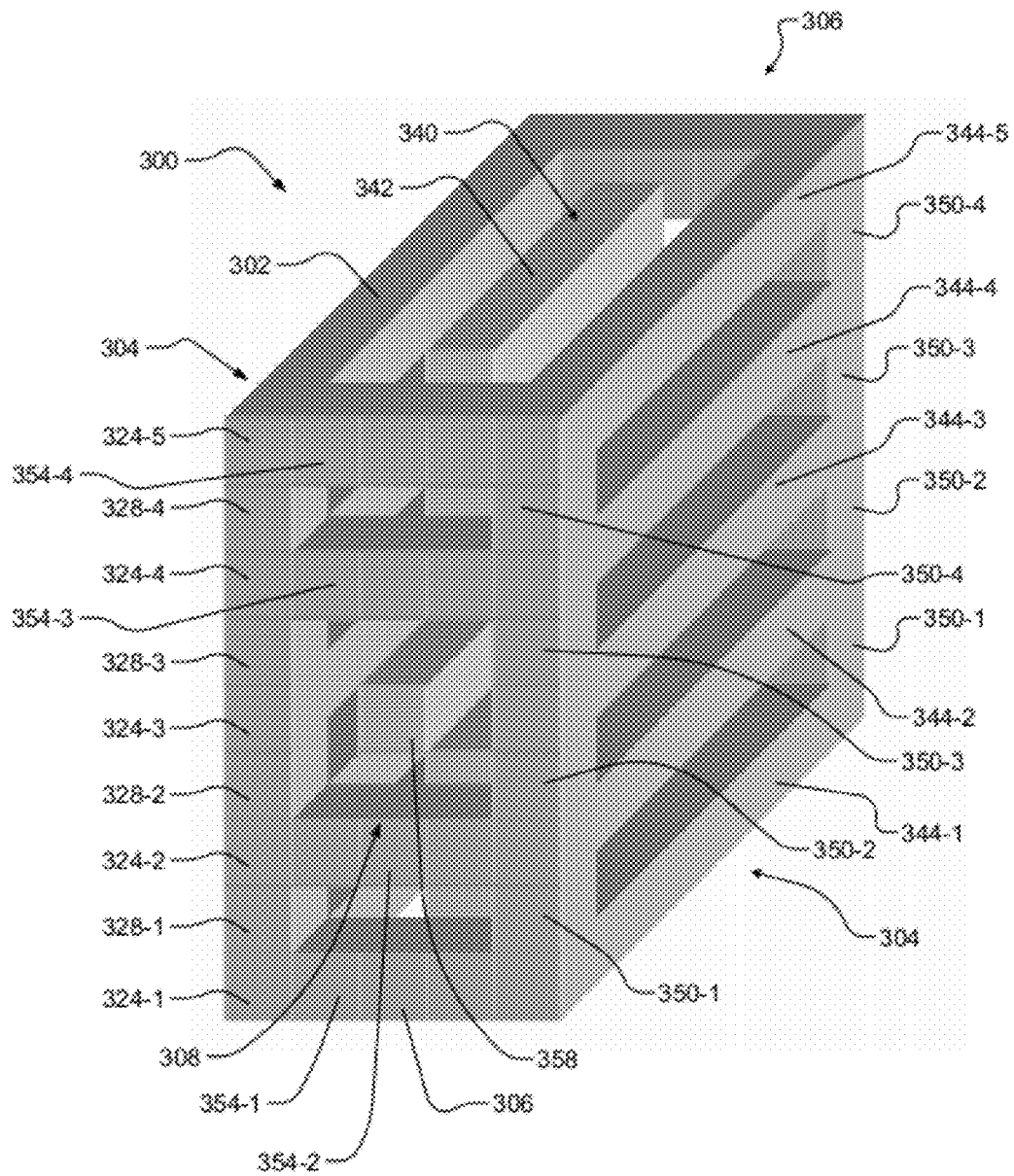
FIG. 8 is a perspective view illustrating another MOM capacitor according to the present disclosure.

Referring now to FIG. 8, a MOM capacitor 300 according to the present disclosure is shown. The MOM capacitor 300 is similar to the MOM capacitor 200 but with increased via spacing. The MOM capacitor 300 may be fabricated in a multi-layer integrated circuit. The MOM capacitor 300 includes an outer conducting structure 302 with opposing walls 304 and opposing walls 306.

The MOM capacitor 300 includes metal layers 324-1 (or M1), 324-2 (or M2), 324-3 (or M3), 324-4 (or M4), and 324-5 (or M5) (collectively metal layers 324) with intervening via layers 328-1 (or VIA1), 328-2 (or VIA2), 328-3 (or VIA3), and 328-4 (or VIA4) (collectively via layers 328). While five metal layers are shown, additional or fewer metal layers and intervening via layers may be used.

The sidewalls 304 define elongate conducting sections 344-1, 344-2, 344-3, 344-4, and 344-5 (collectively conducting sections 344) in the metal layers 324 and spaced hole vias 350-1, 350-2, 350-3, and 350-4 (collectively hole vias 350) arranged in corners of the outer conducting structure 302. The opposing walls 306 include elongate conducting sections 354-1, 354-2, 354-3, 354-4, and 354-5 (collectively conducting sections 354) in the metal layers 324-1, 324-2, 324-4 and 324-5, respectively. An elongate conducting section is missing in the metal layer 324-3 to allow conducting extensions 358 to pass through the opposing walls 306 of the outer conducting structure 302.

Figure 9:
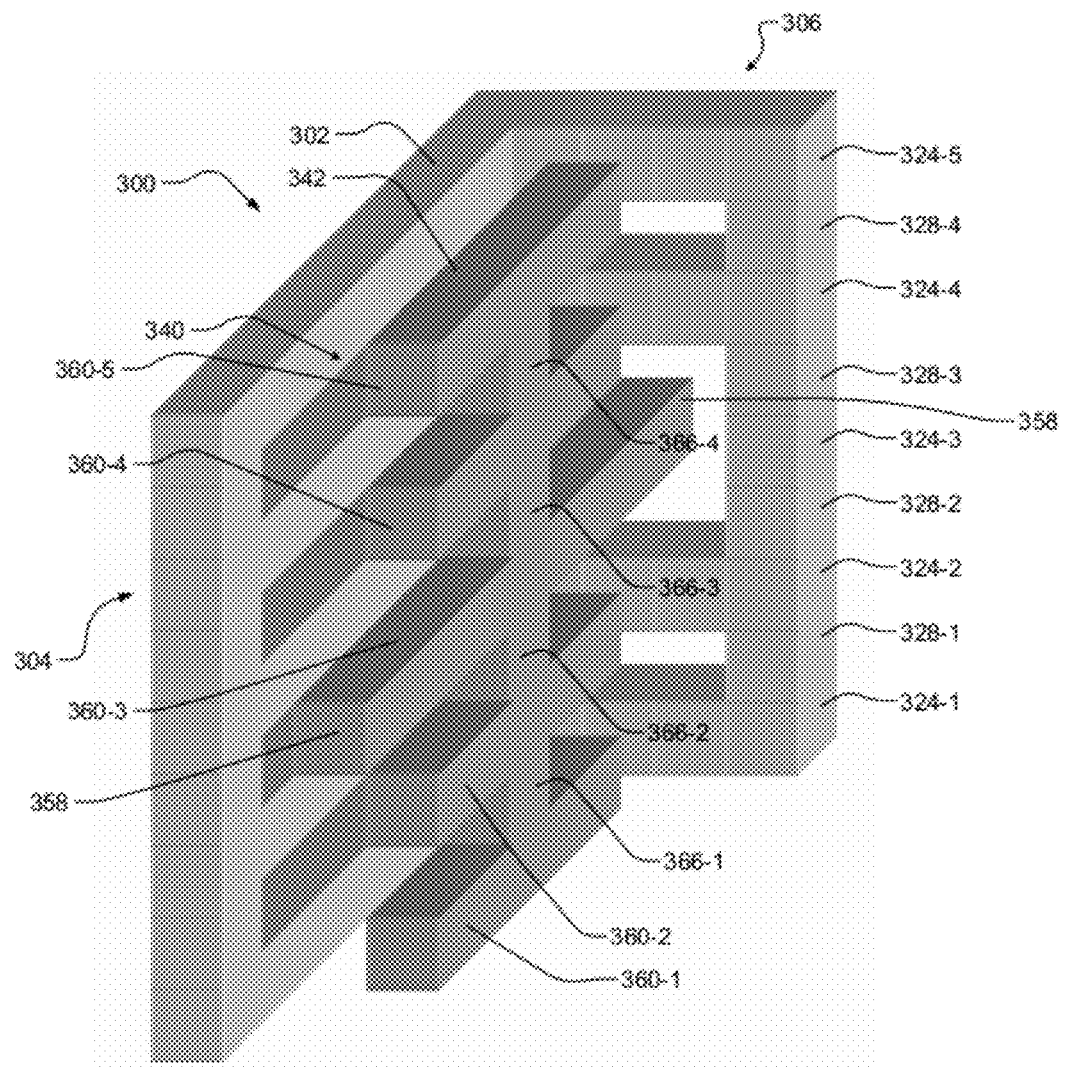
FIG. 9 is a partial perspective view illustrating the MOM capacitor of FIG. 8.

Referring now to FIG. 9, an inner conducting structure 340 is arranged inside of the outer conducting structure 302 and includes a center section 342 and the conducting extensions 358. As can be seen, the conducting extensions 358 extend through the opposing walls 306 of the outer conducting structure 302. The center section 342 includes elongate conducting sections 360-1, 360-2, . . . , and 360-5 (collectively elongate sections 360) in the metal layers 324 and hole vias 366-1, 366-2, 366-3, and 366-4 (collectively hole vias 366). The hole vias 366 may be arranged in a column in the via layers 328 in a center of the inner conducting structure 340, although other locations may be suitable.

Figure 10:
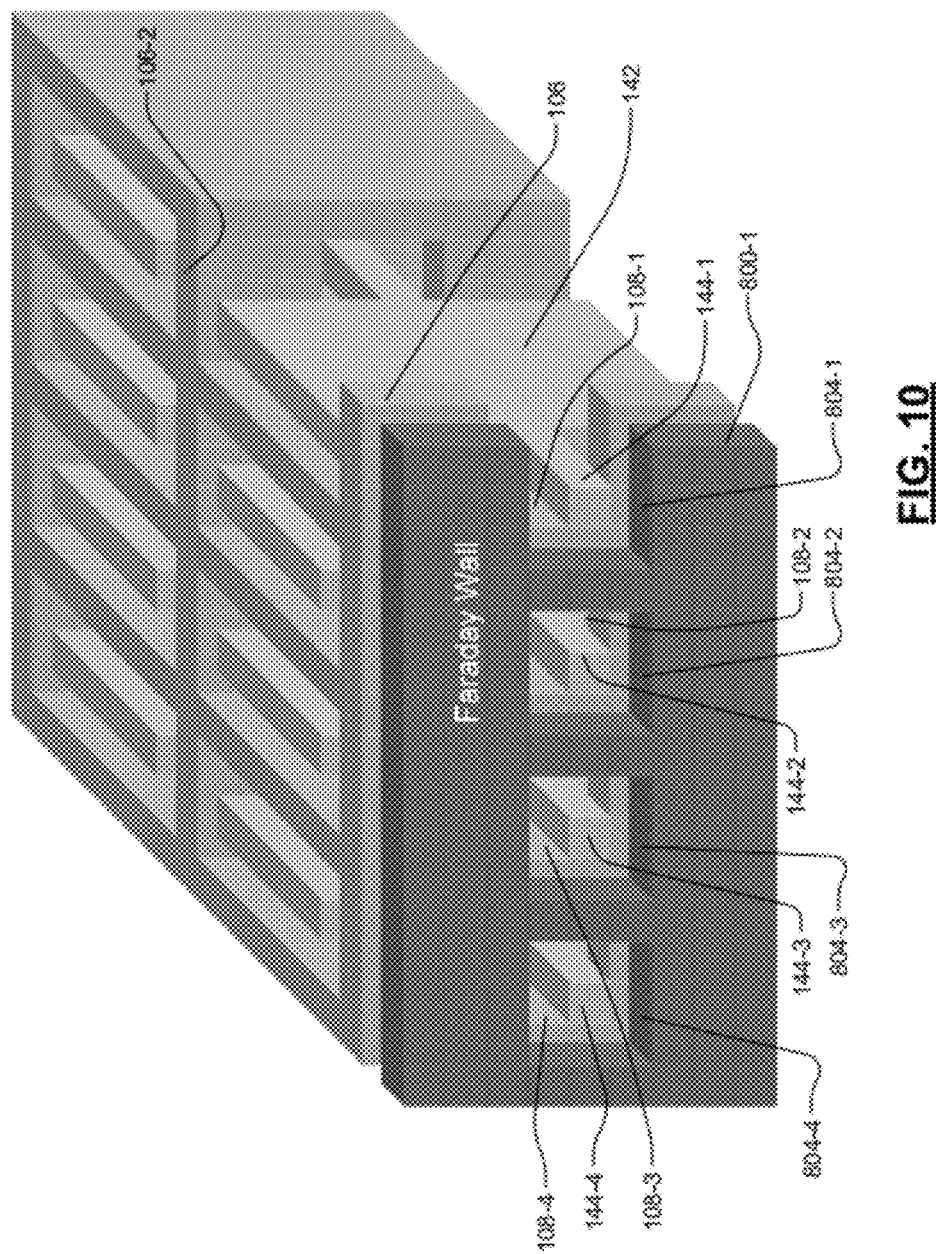
FIG. 10 is a partial perspective view illustrating the MOM capacitor array of FIG. 5 including a Faraday wall according to the present disclosure.
Figure 11:
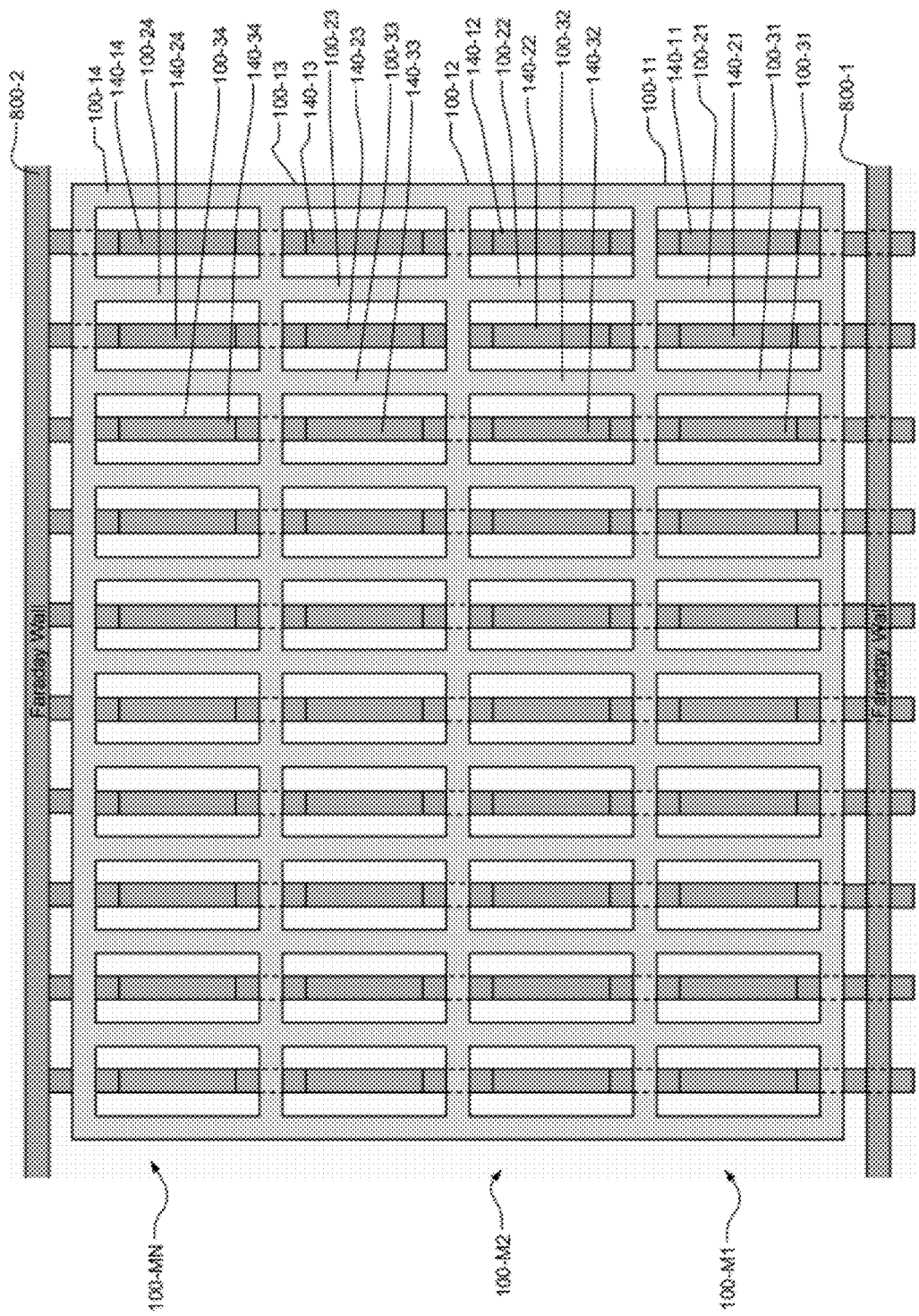
FIG. 11 is a plan view illustrating the MOM capacitor array of FIG. 10.

Referring now to FIGS. 10-11, the MOM capacitor array of FIG. 3 is shown with Faraday walls 800-1 and 800-2 according to the present disclosure. As can be appreciated, Faraday walls can be used in conjunction with any of the other MOM capacitors disclosed herein. The Faraday wall 800-1 is arranged adjacent to the walls 106 and includes openings 804-1, 804-2, 804-3 and 804-4 that align with openings 108-1, 108-2, 108-3 and 108-4, respectively, to allow the conducting extensions 144-1, 144-2, 144-3 and 144-4, respectively, to pass therethrough. Likewise, the Faraday wall 800-2 in FIG. 11 is arranged adjacent to the walls 106 and includes openings 804-1, 804-2, 804-3 and 804-4 that align with openings 110-1, 110-2, 110-3 and 110-4, respectively, to allow the conducting extensions 145-1, 145-2, 145-3 and 145-4, respectively, to pass therethrough. The Faraday walls 800-1 and 800-2 may include conducting extensions in metal layers and trench vias or hole vias in via layers. The Faraday walls 800-1 and 800-2 may be fixed at a given potential and are used to reduce or prevent parasitic capacitance introduced by connections to the MOM capacitor array.

As can be seen in FIG. 11, the connections between the MOM capacitors 100 in a column may be varied to adjust the capacitance of the column. Likewise, the connections between capacitors in adjacent columns may be varied to adjust the overall capacitance of an array 182. The inner conducting structures 140-12, 140-13, 140-14, 140-23 and 140-24, respectively associated with MOM capacitors 100-

12, 100-13, 100-14, 100-23 and 100-24, respectively are connected to the Faraday wall 800-2. The inner conducting structures 140-34, 140-33, 140-32, 140-31, 140-22, 140-21 and 140-11 associated with MOM capacitors 100-34, 100-33, 100-32, 100-31, 100-22, 100-21 and 100-11, respectively are connected to one input of the capacitor array (connection not shown) through the Faraday wall 800-1. The outer conducting structures 102 for all of the MOM capacitors 100 are connected together and to another input of the capacitor array (connection not shown).

As can be appreciated, the MOM capacitors disclosed herein can be used in any circuit including a capacitor and/or capacitor array. For example only, the MOM capacitors can be used in analog to digital converters (ADCs) such as successive approximation (SAR) ADCs. For example only, the MOM capacitors can also be used in capacitive digital to analog converters (DACs) or capacitive DACs used in SAR ADCs. Use of the MOM capacitors and/or MOM capacitor arrays disclosed herein is particularly advantageous in ADCs and DACs since precise capacitance values are highly desirable. Still other implementations and/or usage in other circuit components and devices are contemplated.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

What is claimed is:

1. A metal oxide metal (MOM) capacitor, the MOM capacitor comprising one or more capacitor cells and further comprising:
    an outer conducting structure of a single capacitor cell of the one or more capacitor cells, the outer conducting structure defined in a plurality of metal layers and a plurality of via layers of an integrated circuit, the outer conducting structure of the single capacitor cell including
        a first set of opposing side walls, the first set of opposing side walls including a first side wall and a second side wall opposite the first side wall,
        a second set of opposing side walls, the second set of opposing side walls including a third side wall and a fourth side wall opposite the third side wall, wherein
            (i) the plurality of metal layers together and (ii) the plurality of via layers together form the first set of opposing side walls and the second set of opposing sidewalls of the outer conducting structure of the single capacitor cell,
            the plurality of metal layers are alternately arranged with the plurality of via layers to form the first set of opposing sidewalls and the second set of opposing sidewalls, and
            the third side wall and the fourth side wall of the second set of opposing side walls include a first plurality of hole vias in a lattice arrangement formed by the alternately arranged plurality of metal layers and plurality of via layers,
    a cavity with first and second openings, the cavity defined by the first side wall, the second side wall, the third side wall, and the fourth side wall, and openings in the first side wall and the second side wall;
    an inner conducting structure of the single capacitor cell defined in the plurality of metal layers and the plurality of via layers of the integrated circuit, wherein (i) the plurality of metal layers together and (ii) the plurality of via layers together form the inner conducting structure of the single capacitor cell, and wherein the inner conducting structure of the single capacitor cell is arranged in the cavity of the outer conducting structure of the single capacitor cell and includes
        a body,
        conducting extensions that extend from the body outward from the cavity and through the openings in the first side wall and the second side wall, and
        a second plurality of hole vias in a lattice arrangement; and
    oxide arranged between the outer conducting structure and the inner conducting structure of the single capacitor cell.

2. The MOM capacitor of claim 1, wherein
    the outer conducting structure of the single capacitor cell has a rectangular cross section in each of the plurality of metal layers and wherein first trench vias in the plurality of via layers are used to connect conducting sections in adjacent ones of the metal layers of the outer conducting structure of the single capacitor cell; and
    the inner conducting structure of the single capacitor cell has a rectangular cross section in each of the plurality of metal layers and wherein second trench vias connect conducting sections in adjacent ones of the metal layers of the inner conducting structure of the single capacitor cell.

3. The MOM capacitor of claim 1, wherein the outer conducting structure of the single capacitor cell has a rectangular cross section in each of the plurality of metal layers and wherein first hole vias in the plurality of via layers are arranged in a plurality of columns and connect conducting sections in adjacent ones of the metal layers of the outer conducting structure of the single capacitor cell.

4. The MOM capacitor of claim 3, wherein
    the inner conducting structure of the single capacitor cell has a rectangular cross section in each of the plurality of metal layers and wherein second hole vias in the plurality of via layers are arranged in a plurality of columns and connect conducting sections in adjacent ones of the metal layers of the inner conducting structure of the single capacitor cell.

5. The MOM capacitor of claim 3, wherein
    the inner conducting structure of the single capacitor cell has a rectangular cross section in each of the plurality of metal layers and wherein second hole vias in the plurality of via layers are arranged in a single column and connect conducting sections in adjacent ones of the metal layers of the inner conducting structure of the single capacitor cell.

6. The MOM capacitor of claim 3, wherein each of the plurality of columns is arranged in corners of the outer conducting structure of the single capacitor cell.

7. A capacitor array comprising:
    a plurality of the MOM capacitors of claim 1,
    wherein the plurality of MOM capacitors are arranged in N rows and M columns, and wherein each of the plurality of MOM capacitors shares at least two of the first set of opposing walls and the second set of opposing walls with adjacent ones of the plurality of MOM capacitors.

8. The capacitor array of claim 7, wherein
the conducting extensions of first selected ones of the plurality of MOM capacitors are connected together and to a first capacitor input, and
the outer conducting structures of the plurality of MOM capacitors are connected to a second capacitor input.

9. The capacitor array of claim 8, wherein
the conducting extensions of second selected ones of the plurality of MOM capacitors are connected together and to a reference impedance.

10. The capacitor array of claim 8, wherein the inner conducting structures of second selected ones of the plurality of MOM capacitors are not connected to others of the plurality of MOM capacitors.

11. The capacitor array of claim 7, wherein internal connections are used when connecting MOM capacitors in the same column, and wherein external connections are used when connecting MOM capacitors in adjacent columns.

12. The capacitor array of claim 7, further comprising:
a first conducting wall including a first plurality of openings,
wherein the openings in one of the first set of opposing side walls of a first row of the plurality of MOM capacitors in the capacitor array align with the plurality of openings in the first conducting wall, and
wherein the first conducting wall is connected to a reference impedance.

13. The capacitor array of claim 12, further comprising:
a second conducting wall including a second plurality of openings,
wherein the openings in the other of the first set of opposing side walls of a last row of the plurality of MOM capacitors of the capacitor array align with the second plurality of openings in the second conducting wall, and
wherein the second conducting wall is connected to the reference impedance.

14. A digital to analog converter comprising the capacitor array of claim 7.

15. An analog to digital converter comprising the capacitor array of claim 7.

* * * * *